United States Patent
Lin et al.

(10) Patent No.: US 8,906,247 B2
(45) Date of Patent: Dec. 9, 2014

(54) PATTERNING PROCESS FOR OXIDE FILM

(71) Applicant: Industrial Technology Research Institute, Chutung, Hsinchu (TW)

(72) Inventors: Chin-Ching Lin, Taichung (TW);
Yu-Chun Chen, Zhongli (TW);
En-Kuang Wang, Hisnchu (TW);
Mei-Ching Chiang, Zhubei (TW);
Yi-Chen Chen, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/942,162

(22) Filed: Jul. 15, 2013

(65) Prior Publication Data

US 2014/0034605 A1  Feb. 6, 2014

(30) Foreign Application Priority Data

Jul. 31, 2012  (TW) .............................. 101127561 A

(51) Int. Cl.
*B44C 1/22* (2006.01)
*H01L 21/027* (2006.01)

(52) U.S. Cl.
CPC ............ *B44C 1/227* (2013.01); *H01L 21/0272* (2013.01)
USPC ................. 216/40; 216/36; 216/100; 438/722

(58) Field of Classification Search
CPC ............ H01L 21/0272; H01L 21/0331; H01L 21/0337; H01L 21/7688; H01L 21/76883; B44C 1/22
USPC ................... 216/40, 41, 47, 49, 51, 100, 36; 438/722, 725, 669, 670
See application file for complete search history.

(56) References Cited

U.S. PATENT DOCUMENTS

| | | | |
|---|---|---|---|
| 4,451,971 A | 6/1984 | Milgram | |
| 5,281,690 A | 1/1994 | Flaim et al. | |
| 6,666,943 B2 * | 12/2003 | Wada et al. | ................... 156/230 |
| 7,459,400 B2 | 12/2008 | Arias et al. | |
| 7,741,755 B2 | 6/2010 | Fujii | |

(Continued)

FOREIGN PATENT DOCUMENTS

| | | |
|---|---|---|
| JP | 2007144992 A | 6/2007 |
| WO | WO 2009/084850 A2 | 7/2009 |

OTHER PUBLICATIONS

Dy. Shih, et al., "Inplane solvent diffussion in a soluble polyimide liftoff structure", Journal of Vacuum Science and Technology B, pp. 1038-1043 (1990).

(Continued)

*Primary Examiner* — Lan Vinh
(74) *Attorney, Agent, or Firm* — Muncy, Geissler, Olds & Lowe, P.C.

(57) ABSTRACT

The present disclosure provides a patterning process for an oxide film, including: covering a barrier layer composition on a substrate to form a patterned barrier layer, wherein the barrier layer composition includes an inorganic component and an organic binder with a weight ratio of 50-98:2-50; forming an oxide film on the patterned barrier layer and the substrate, wherein a thickness ratio (D1/D2) of the barrier layer (D1) to the oxide film (D2) is about 5-2000; and lifting off the barrier layer and the oxide film thereon, while leaving portions of the oxide film on the substrate.

11 Claims, 1 Drawing Sheet

(56) References Cited

U.S. PATENT DOCUMENTS

| | | |
|---|---|---|
| 8,017,293 B2 | 9/2011 | Almanza-Workman et al. |
| 8,029,964 B1 | 10/2011 | Almanza-Workman et al. |
| 8,039,294 B2 | 10/2011 | Kim et al. |
| 2002/0066525 A1 | 6/2002 | Wada et al. |
| 2006/0105492 A1* | 5/2006 | Veres et al. ............ 438/99 |
| 2006/0166151 A1* | 7/2006 | Ludemann et al. ......... 430/619 |
| 2010/0001316 A1 | 1/2010 | Gmitter et al. |
| 2011/0267409 A1* | 11/2011 | Nawrocki et al. ............ 347/102 |

OTHER PUBLICATIONS

David F. Witman, et al., "A simple Bilayer Lift-Off Process", Microelectronic Engineering vol. 11, pp. 549-552 (1990).

Jaewon Park, et al., "Micropatterning of poly(dimethylsiloxane) using a photoresist lift-off technique for selective electrical insulation of microelectrode arrays", Journal of Micromechanics and Microengineering, PMC, pp. 1-18 (Nov. 27, 2009).

J. K. Emmanouil, et al., "The effect of photo-activated glazes on the microhardness of acrylic baseplate resins", Journal of Dentistry, vol. 30, pp. 7-10 (2002).

M. Horteis et al., "Fundamental Studies on the Front Contact Formation Resulting in a 21% efficiency silicon solar cell with printed rear and front contacts", IEEE 2010, pp. 672-677 (2010).

Xiaokang Huang et al., "Stability of thin resist walls", Journal of the Electrochemical Society, vol. 139, No. 10, pp. 2952-2956 (Oct. 1992).

Taiwanese Office Action dated May 23, 2014, as issued in corresponding Taiwan Patent Application No. 101127561.

* cited by examiner

PATTERNING PROCESS FOR OXIDE FILM

CROSS REFERENCE TO RELATED APPLICATIONS

This application claims priority of Taiwan Patent Application No. 101127561, filed on 31 Jul. 2012, the entirety of which is incorporated by reference herein.

TECHNICAL FIELD

The technical field relates to a patterning process, and in particular relates to a patterning process for oxide films.

BACKGROUND

Patterning of an oxide film is generally realized by photolithography and etching procedures. However, some oxides, such as tin oxide, cannot be etched easily. For example, a tin oxide film cannot be patterned by an etching process in general. Lift-off is another well-known patterning process, which can be used to pattern a tin oxide film. The lift-off process involves the step of removing the oxide film, and the time required to fully remove the oxide film is considered to be a factor determining the efficiency of the lift-off process. There remains a need in the art to improve the removal efficiency of oxide films.

BRIEF SUMMARY

The present disclosure provides a patterning process for an oxide film, including: covering a barrier layer composition on a substrate to form a patterned barrier layer, wherein the barrier layer composition includes an inorganic component and an organic binder with a weight ratio of 50-98:2-50; forming an oxide film on the patterned barrier layer and the substrate, wherein a thickness ratio (D1/D2) of the barrier layer (D1) to the oxide film (D2) is about 5-2000; and lifting off the barrier layer and the oxide film thereon, while leaving portions of the oxide film on the substrate.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

Figure 1:
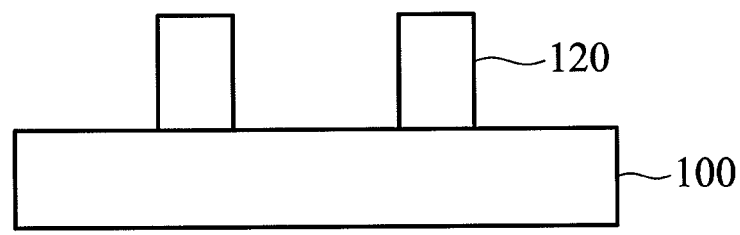
FIGS. 1-3 are cross-sectional views showing a patterning process for oxide film in accordance with the exemplary embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to FIG. 1, a patterning process for oxide films is provided. According to the patterning process of an embodiment, a barrier layer composition is applied on a substrate 100 to form a patterned barrier layer 120. The barrier layer composition may be, for example, printable slurry, which may be coated on the substrate 100 by screen printing or spray printing.

The barrier layer composition may include an inorganic component and an organic binder with a weight ratio of 50-98:2-50. In one embodiment, the barrier layer composition with an inorganic solid content of above about 50 wt % or about 50-90 wt % forms an easy-to-remove barrier layer. If the barrier layer composition contains excess organic binder (about >50 wt %), the adhesion strength between the barrier layer and the substrate becomes too high. The removal of the barrier layer from the substrate would be difficult as the result of a high temperature treatment; In contrast, if the barrier layer composition contains excess inorganic solid content (about >98 wt %), it would be difficult to form a film with the printable slurry. In other embodiments, the barrier layer composition may include other components, and the weight ratio of the inorganic component to organic binder is controlled, within a range of about 50-98:2-50.

The inorganic component of the barrier layer composition may include one or more metals (e.g. aluminum, silver, or copper), metal oxides (e.g. titanium oxide, tin oxide, phosphorus oxide, or aluminum oxide), silicon oxide, or combinations thereof. The organic binder may include, but not be limited to: ethyl cellulose, hydroxyethyl cellulose, hydroxypropyl cellulose, hydroxypropyl methyl cellulose (HPMC), methyl cellulose, carboxymethyl cellulose (CMC), epoxy resin, acrylic resin, or a mixture thereof. Moreover, the organic binder may further be dissolved in a solvent (for example, terpineol). In one embodiment, the barrier layer composition includes about 50-80 wt % of titanium oxide, 18-45 wt % of silicon oxide, and the remaining balance of organic binder, such as ethyl cellulose. In another embodiment, the barrier layer composition includes a metal slurry including 60-70 wt % of metal particles, 15-20 wt % of inorganic oxides, and the remaining balance of the barrier layer composition is an organic binder, such as epoxy resin.

The inorganic solid content of the barrier layer composition may be adjusted in accordance with the desirable thickness of the barrier layer. In one embodiment, if the thickness of the barrier layer 120 is 3-5 um, the inorganic solid content of the barrier layer composition may be controlled to be about 80-98 wt % or about 95 wt %. Moreover, if the thickness of the barrier layer 120 is about 10-15 um, the inorganic solid content of the barrier layer composition may be controlled to be about 50-80 wt % or about 75 wt %. In another embodiment, the inorganic solid content of the barrier layer composition is about 90-98 wt %.

The barrier layer composition may be printed on a variety of substrates (including, but not be limited to: glass, silicon chip, ceramic, polymer, metal, and the like) through screen printing or spray printing techniques using a screen mesh or a mask.

Figure 2:
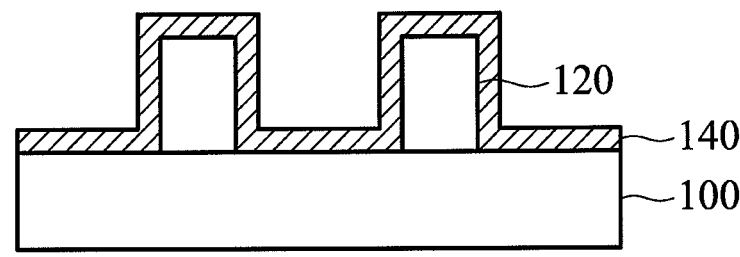

Referring to FIG. 2, an oxide thin film 140 is deposited conformally over the barrier layer 120 and the substrate 100 at a temperature of about 100-550□ or about 200-400□. The thickness ratio (D1/D2) of the barrier layer 120 (D1) to the oxide film 140 (D2) may be not less than 5, for example, within the range of about 5-2000, about 5-1000, or about 10-100. If the thickness ratio (D1/D2) is less than 5, difficulties occur during the subsequent lift-off process. For example, incomplete peeling of the barrier layer, rough edges, or burring of the patterns after the removal of the barrier layer.

The oxide film and the inorganic component in the barrier layer composition are different materials. In one preferred embodiment, the oxide film may be metal oxides. The metal oxides may include, but not be limited to: tin oxide, zinc oxide, indium tin oxide (ITO), fluorine-doped tin oxide (FTO), lithium-fluorine-doped tin oxide (LFTO), indium gallium zinc oxide (IGZO), or combinations thereof. In addition, a layer of oxide film 140 is shown in the figure, a multi-layer stack of oxide films (of the same or different materials) may also be formed as long as the thickness ratio of the total thickness of the multi-layer stack to the barrier layer 120 is no less than 5.

Figure 3:
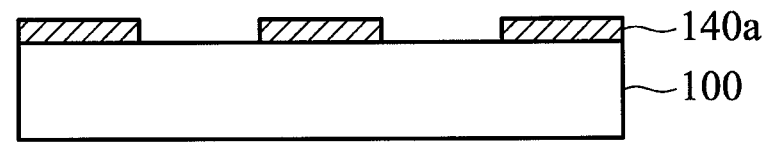

Referring to FIG. 3, the barrier layer 120 and the oxide film 140 on the barrier layer 120 are lifted-off to leave a patterned oxide film 140 on the substrate 100. The lift-off procedure may utilize a lift-off solution, for example. In one embodiment, the component of the barrier layer composition, and the thickness ratio of barrier layer/oxide film are well controlled such that the barrier layer 140 may be easily removed by using an aqueous solution in the final lift-off step. Moreover, the edges of the resulting patterned oxide film 140a are sharp and non-burring. In one embodiment, water may be used as the lift-off solution in the lift-off procedure. In another embodiment, a lift-off solution other than water, including an acidic solution, basic solution, or organic solution, may be used in the lift-off procedure. For example, ammonia water, acetic acid solution, dimethyl sulfoxide (DMSO), ethanolamine (ETA), or the like may also be applied as the lift-off solution in the disclosure. The pH value of the lift-off solution used in the disclosure is in between 2-13. Strong acids (pH<2) or strong bases (pH>13) may damage the substrate.

EXAMPLES

Examples 1-5

Barrier Layer Composition/Oxide Film: Ink/LFTO

The patterning process for oxide film of Examples 1-5 is described below. The process parameters of each example are shown in Table 1 with a pattern linewidth of 100 um.

Firstly, a ceramic substrate (an aluminum oxide plate of a thickness of 0.5 mm) was rinsed. Secondly, the ink was printed on the substrate through a screen printing process using a screen mesh to form a patterned barrier layer. The thickness of the patterned barrier layer is D1. Next, lithium-fluorine-doped tin oxide (LFTO) was deposited on the patterned barrier layer in the environment of 370° C. to form a coating. The thickness of the LFTO coating was D2. Finally, the ink material was removed by a lift-off solution to obtain the patterns of the LFTO coating.

The ink used in Examples 1-5 was a mixture of inorganic titanium oxide and silicon oxide. The ratio of each component of the ink was 70 wt % of titanium oxide, 25 wt % of silicon oxide, and 5 wt % of organic binder (the organic binder was made by dissolving 10 g ethyl cellulose in 70 g terpineol, ethyl cellulose and terpineol were manufactured by Aldrich). The doping amount of lithium and fluorine in the LFTO were 0.5 at % and 2 at %, respectively.

TABLE 1

| Examples | thickness of LFTO (um) (D2) | thickness of barrier layer (um) (D1) | thickness ratio (D1/D2) | coating temperature (° C.) | lift-off solution | lift-off duration | efficiency |
|---|---|---|---|---|---|---|---|
| 1 | 0.1 | 10 | 100.0 | 370 | water | 5 sec | excellent |
| 2 | 0.2 | 10 | 50.0 | 370 | water | 5 sec | excellent |
| 3 | 0.3 | 10 | 33.3 | 370 | water | 5 sec | excellent |
| 4 | 0.3 | 3 | 10.0 | 370 | water | 10 sec | excellent |
| 5 | 0.3 | 1 | 3.3 | 370 | water | 5 min | poor |

Note: in the tables, the efficiency of examples rated as excellent indicates that the barrier layer could be removed by immersion in a short period (<3 mins) and the edges of the patterns were sharp and non-burring. The efficiency of examples rated as poor indicates that, after a long period (>3 mins) of immersion, the barrier layer could not be removed, or only a little portion of the barrier layer was removed and a great portion of the barrier layer remained on the substrate, or more than a half of the barrier layer was removed but the rest remained on the substrate and could not be removed, or the barrier layer was removed but the patterns contained burring or rough edges.

Examples 6-10

Barrier Layer Composition/Oxide Film: Metal Slurry/LFTO

The patterning process for oxide film of Examples 6-10 is described below. The process parameters of each example are shown in Table 2 with a pattern linewidth of 100 um.

Firstly, a metal substrate (a galvanized steel plate of a thickness of 0.5 mm, manufactured by China Steel Corporation) was rinsed. Secondly, the metal slurry was printed on the substrate through a screen printing process using a screen mesh to form a patterned barrier layer. The thickness of the patterned barrier layer was D1. Next, lithium-fluorine-doped tin oxide (LFTO) was deposited on the patterned barrier layer in the environment of 390° C. to form a coating. The thickness of the LFTO coating was D2. Finally, the metal slurry was removed by a lift-off solution to obtain the patterns of the LFTO coating.

The metal slurry used in Examples 6-10 was a mixture of inorganic oxide and metal particles. The ratio of each component of the ink was 65 wt % of nano-silver particles (average size of 20 nm), 15 wt % of silicon oxide, and 20 wt % of epoxy resin (the epoxy resin was bisphenol A epoxy resin manufactured by Aldrich, and the solvent was a 70/30 mixed solvent of xylene/isobutanol). The doping amount of lithium and fluorine in the LFTO were 0.5 at % and 2 at %, respectively. An acetic acid solution (weak acid) (concentration of about 0.01 wt %) with a pH value of about 5 was used as the lift-off solution.

TABLE 2

| Examples | thickness of LFTO (um) (D2) | thickness of barrier layer (um) (D1) | thickness ratio (D1/D2) | coating temperature (° C.) | lift-off solution | lift-off duration | efficiency |
|---|---|---|---|---|---|---|---|
| 6 | 0.1 | 10 | 100.0 | 390 | acetic acid solution | 20 sec | excellent |
| 7 | 0.2 | 10 | 50.0 | 390 | acetic acid solution | 20 sec | excellent |
| 8 | 0.3 | 10 | 33.3 | 390 | acetic acid solution | 20 sec | excellent |
| 9 | 0.3 | 3 | 10.0 | 390 | acetic acid solution | 15 sec | excellent |
| 10 | 0.3 | 1 | 3.3 | 390 | acetic acid solution | 10 min | poor |

Examples 11-13

Barrier Layer Composition/Oxide Film: Ink/ITO

The patterning process for oxide film of Examples 11-13 is described below. The process parameters of each example are shown in Table 3 with a pattern linewidth of 100 um.

Firstly, a glass substrate was rinsed. Secondly, the ink was printed on the substrate through a screen printing process using a screen mesh to form a patterned barrier layer. The thickness of the patterned barrier layer was D1. Next, an indium tin oxide (ITO) was deposited on the patterned barrier layer in the environment of 220° C. to form a coating. The thickness of the ITO coating was D2. Finally, the ink material was removed by a lift-off solution to obtain the patterns of the ITO coating.

The ink used in Examples 11-13 was a mixture of inorganic tin oxide and silicon oxide. The ratio of each component of the ink was 70 wt % of tin oxide, 25 wt % of silicon oxide, and 5 wt % of organic binder (the organic binder was made by dissolving 10 g of ethyl cellulose in 70 g terpineol, ethyl cellulose and terpineol were manufactured by Aldrich). Ammonia water (a weak base) (concentration of about 0.014 wt %) with a pH value of about 9 was used as the lift-off solution.

Examples 14-16

Barrier Layer Composition/Oxide Film: Metal Slurry/Silicon Oxide

The patterning process for oxide film of Examples 14-16 is described below. The process parameters of each example are shown in Table 4 with a pattern linewidth of 100 um.

Firstly, a polymer substrate was rinsed. Secondly, the metal slurry was printed on the substrate through a screen printing process using a screen mesh to form a patterned barrier layer. The thickness of the patterned barrier layer was D1. Next, a silicon oxide ($SiO_x$) was deposited on the patterned barrier layer in the environment of 130° C. to form a coating. The thickness of the silicon oxide coating was D2. Finally, the metal slurry was removed by a lift-off solution to obtain the patterns of the silicon oxide coating.

The ink used in Examples 14-16 was a mixture of inorganic oxide and metal particles. The ratio of each component of the ink was 65 wt % of nano-aluminum particles (average size of 100 nm), 15 wt % of silicon oxide, and 20 wt % of epoxy resin (the epoxy resin was bisphenol A epoxy resin manufactured by Aldrich, and the solvent was a 70/30 mixed solvent of xylene/isobutanol).

TABLE 3

| Examples | thickness of ITO (um) (D2) | thickness of barrier layer (um) (D1) | thickness ratio (D1/D2) | coating temperature (° C.) | lift-off solution | lift-off duration | efficiency |
|---|---|---|---|---|---|---|---|
| 11 | 0.1 | 10 | 100.0 | 220 | ammonia water | 20 sec | excellent |
| 12 | 0.2 | 2 | 10.0 | 220 | ammonia water | 60 sec | excellent |
| 13 | 0.3 | 1 | 3.3 | 220 | ammonia water | >3 min | poor |

TABLE 4

| Examples | thickness of silicon oxide (um) (D2) | thickness of barrier layer (um) (D1) | thickness ratio (D1/D2) | coating temperature (° C.) | lift-off solution | lift-off duration | efficiency |
|---|---|---|---|---|---|---|---|
| 14 | 0.1 | 10 | 100.0 | 130 | water | 20 sec | excellent |
| 15 | 0.2 | 2 | 10.0 | 130 | water | 120 sec | excellent |
| 16 | 0.3 | 1 | 3.3 | 130 | water | >5 min | poor |

Examples 17-19

Barrier Layer Composition/Oxide Film: Ink/FTO

The patterning process for oxide film of Examples 17-19 is described below. The process parameters of each example are shown in Table 5 with a pattern linewidth of 100 um.

Firstly, a glass substrate was rinsed. Secondly, the ink was printed on the substrate through a screen printing process using a screen mesh to form a patterned barrier layer. The thickness of the patterned barrier layer was D1. Next, a fluorine-doped tin oxide (FTO) was deposited on the patterned barrier layer in the environment of 370° C. to form a film. The thickness of the FTO film was D2. Finally, the ink material was removed by a lift-off solution to obtain the patterns of the FTO coating.

The ink used in Examples 17-19 was a mixture of inorganic titanium oxide and silicon oxide. The ratio of each component of the ink was 70 wt % of titanium oxide, 25 wt % of silicon oxide, and 5 wt % of organic binder (the organic binder is made by dissolving 10 g of ethyl cellulose in 70 g terpineol, ethyl cellulose and terpineol were manufactured by Aldrich). The doping values of fluorine in the FTO was 2 at %.

TABLE 5

| Examples | thickness of FTO (um) (D2) | thickness of barrier layer (um) (D1) | thickness ratio (D1/D2) | coating temperature (° C.) | lift-off solution | lift-off duration | efficiency |
|---|---|---|---|---|---|---|---|
| 17 | 0.1 | 10 | 100.0 | 370 | water | 5 sec | excellent |
| 18 | 0.3 | 3 | 10.0 | 370 | water | 10 sec | excellent |
| 19 | 0.3 | 1 | 3.3 | 370 | water | 5 min | poor |

Examples 20-22

Barrier Layer Composition/Oxide Film: Metal Slurry/TO

The patterning process for oxide film of Examples 20-22 is described below. The process parameters of each example are shown in Table 6 with a pattern linewidth of 100 um.

Firstly, a glass substrate was rinsed. Secondly, the metal slurry was printed on the substrate through a screen printing process using a screen mesh to form a patterned barrier layer. The thickness of the patterned barrier layer was D1. Next, a tin oxide (TO) was deposited on the patterned barrier layer in the environment of 400° C. to form a coating. The thickness of the TO coating was D2. Finally, the metal slurry was removed by a lift-off solution to obtain the patterns of the TO coating.

The ink used in Examples 20-22 was a mixture of inorganic oxide and metal particles. The ratio of each component of the ink was 65 wt % of nano-silver particles (average size of 50 nm), 15 wt % of silicon oxide, and 20 wt % of epoxy resin (the epoxy resin was bisphenol A epoxy resin manufactured by Aldrich, and the solvent was a 70/30 mixed solvent of xylene/isobutanol).

TABLE 6

| Examples | thickness of TO (um) (D2) | thickness of barrier layer (um) (D1) | thickness ratio (D1/D2) | coating temperature (° C.) | lift-off solution | lift-off duration | efficiency |
|---|---|---|---|---|---|---|---|
| 20 | 0.2 | 10 | 50.0 | 400 | water | 20 sec | excellent |
| 21 | 0.3 | 3 | 10.0 | 400 | water | 3 min | excellent |
| 22 | 0.3 | 1 | 3.3 | 400 | water | 10 min | poor |

Comparative Examples 1-10

Photoresist/LFTO

The patterning process for oxide film of Comparative Examples 1-10 is described below. The process parameters of each example are shown in Tables 7 and 8 with a pattern linewidth of 100 um.

Firstly, a glass substrate was rinsed. Secondly, the photoresist (phenol-formaldehyde based photoresist, model number: AZ 1505, manufactured by AZ Electronic Materials, Comparative Examples 1-5) or polyimide (PI, photo-sensitive polyimide, manufactured by Eternal Chemical, Comparative Examples 6-10) was applied on the substrate through a wet coating process, then a photolithography process was used to form a patterned barrier layer. The thickness of the patterned barrier layer was D1. Next, a lithium-fluorine-doped tin oxide (LFTO) was deposited on the patterned barrier layer in the environment of 360° C. to form a coating. The thickness of the LFTO coating was D2. Finally, the photoresist was removed by a dimethyl sulfoxide/ethanolamine (DMSO/MEA=30 wt %/70 wt %) solution to obtain the patterns of the LFTO coating.

The doping values of lithium and fluorine in the LFTO used in Comparative Examples 1-10 were 0.5 at % and 2 at %, respectively.

Comparative Examples 11-13

Photoresist/ITO

The patterning process for oxide film of Comparative Examples 11-13 is described below. The process parameters of each example are shown in Table 9 with a pattern linewidth of 100 um.

Firstly, a polymer substrate was rinsed. Secondly, the photoresist (AZ 1505, manufactured by AZ Electronic Materials) was applied on the substrate through a wet coating process, then a photolithography process was used to form a patterned barrier layer. The thickness of the patterned barrier layer was D1. Next, an indium tin oxide (ITO) was deposited on the patterned barrier layer in the environment of 220° C. to form a coating. The thickness of the ITO coating was D2. Finally, the photoresist was removed by a dimethyl sulfoxide/ethanolamine (DMSO/MEA=30 wt %/70 wt %) solution to obtain the patterns of the ITO coating.

TABLE 7

| Comparative Examples | thickness of LFTO (um) (D2) | thickness of barrier layer (um) (D1) | thickness ratio (D1/D2) | coating temperature (° C.) | lift-off solution | lift-off duration | efficiency |
|---|---|---|---|---|---|---|---|
| 1 | 0.1 | 1 | 10.0 | 360 | DMSO/MEA | 10 min | poor |
| 2 | 0.2 | 1 | 5.0 | 360 | DMSO/MEA | >15 min | poor |
| 3 | 0.3 | 1 | 3.3 | 360 | DMSO/MEA | >30 min | poor |
| 4 | 0.3 | 0.8 | 2.7 | 360 | DMSO/MEA | not removable | poor |
| 5 | 0.3 | 2 | 6.7 | 360 | DMSO/MEA | 15 min | poor |

TABLE 8

| Comparative Examples | thickness of LFTO (um) (D2) | thickness of barrier layer (um) (D1) | thickness ratio (D1/D2) | coating temperature (° C.) | lift-off solution | lift-off duration | efficiency |
|---|---|---|---|---|---|---|---|
| 6 | 0.1 | 10 | 100.0 | 360 | DMSO/MEA | 5 min | poor |
| 7 | 0.2 | 10 | 50.0 | 360 | DMSO/MEA | 5 min | poor |
| 8 | 0.3 | 10 | 33.3 | 360 | DMSO/MEA | 10 min | poor |
| 9 | 0.3 | 5 | 16.7 | 360 | DMSO/MEA | 15 min | poor |
| 10 | 0.3 | 1.2 | 4.0 | 360 | DMSO/MEA | not removable | poor |

TABLE 9

| Comparative Examples | thickness of ITO (um) (D2) | thickness of barrier layer (um) (D1) | thickness ratio (D1/D2) | coating temperature (°C.) | lift-off solution | lift-off duration | efficiency |
|---|---|---|---|---|---|---|---|
| 11 | 0.1 | 1 | 10.0 | 220 | DMSO/MEA | 10 min | poor |
| 12 | 0.2 | 1 | 5.0 | 220 | DMSO/MEA | >15 min | poor |
| 13 | 0.3 | 1 | 3.3 | 220 | DMSO/MEA | >30 min | poor |

Comparative Examples 14-16

Photoresist/$SiO_x$

The patterning process for oxide film of Comparative Examples 14-16 is described below. The process parameters of each example are shown in Table 10 with a pattern linewidth of 100 um.

Firstly, a silicon substrate was rinsed. Secondly, the photoresist (AZ 5214-E, manufactured by Clariant Ltd.) was applied on the substrate through a wet coating process, then a photolithography process was used to form a patterned barrier layer. The thickness of the patterned barrier layer was D1. Next, a silicon oxide ($SiO_x$) was deposited on the patterned barrier layer in the environment of 130° C. to form a film coating. The thickness of the silicon oxide film coating was D2. Finally, the photoresist was removed by a dimethyl sulfoxide/ethanolamine (DMSO/MEA=30 wt %/70 wt %) solution to obtain the patterns of the silicon oxide film.

TABLE 10

| Comparative Examples | thickness of silicon oxide (um) (D2) | thickness of barrier layer (um) (D1) | thickness ratio (D1/D2) | coating temperature (°C.) | lift-off solution | lift-off duration | efficiency |
|---|---|---|---|---|---|---|---|
| 14 | 0.1 | 1 | 10.0 | 130 | DMSO/MEA | 10 min | poor |
| 15 | 0.2 | 1 | 5.0 | 130 | DMSO/MEA | >15 min | poor |
| 16 | 0.3 | 1 | 3.3 | 130 | DMSO/MEA | >30 min | poor |

Comparative Examples 17-19

PI Photoresist/FTO

The patterning process for oxide film of Comparative Examples 17-19 is described below. The process parameters of each example are shown in Table 11 with a pattern linewidth of 100 um.

Firstly, a glass substrate was rinsed. Secondly, the polyimide photoresist (PI, photo-sensitive polyimide, manufactured by Eternal Chemical) was applied on the substrate through a wet coating process, and then a photolithography process was used to form a patterned barrier layer. The thickness of the patterned barrier layer was D1. Next, a fluorine-doped tin oxide (FTO) was deposited on the patterned barrier layer in the environment of 370° C. to form a coating. The thickness of the FTO coating was D2. Finally, the photoresist was removed by a dimethyl sulfoxide/ethanolamine (DMSO/MEA=30 wt %/70 wt %) solution to obtain the patterns of the FTO coating.

The doping amount of fluorine in the FTO used in Comparative Examples 17-19 was 2 at %.

TABLE 11

| Comparative Examples | thickness of FTO (um) (D2) | thickness of barrier layer (um) (D1) | thickness ratio (D1/D2) | coating temperature (° C.) | lift-off solution | lift-off duration | efficiency |
|---|---|---|---|---|---|---|---|
| 17 | 0.2 | 10 | 50.0 | 370 | DMSO/MEA | 5 min | poor |
| 18 | 0.3 | 5 | 16.7 | 370 | DMSO/MEA | 20 min | poor |
| 19 | 0.3 | 1.2 | 4.0 | 370 | DMSO/MEA | not removable | poor |

Comparative Examples 20-22

PI Photoresist/TO

The patterning process for oxide film of Comparative Examples 20-22 is described below. The process parameters of each example are shown in Table 12 with a pattern linewidth of 100 um.

Firstly, a glass substrate was rinsed. Secondly, the polyimide photoresist (PI, photo-sensitive polyimide, manufactured by Eternal Chemical) was applied on the substrate through a wet coating process, and then a photolithography process was used to form a patterned barrier layer. The thickness of the patterned barrier layer was D1. Next, a tin oxide (TO) was deposited on the patterned barrier layer in the environment of 400° C. to form a coating. The thickness of the TO coating was D2. Finally, the photoresist was removed by a dimethyl sulfoxide/ethanolamine (DMSO/MEA=30 wt %/70 wt %) solution to obtain the patterns of the TO coating.

TABLE 6

| Comparative Examples | thickness of TO (um) (D2) | thickness of barrier layer (um) (D1) | thickness ratio (D1/D2) | coating temperature (° C.) | lift-off solution | lift-off duration | efficiency |
|---|---|---|---|---|---|---|---|
| 20 | 0.1 | 1 | 10.0 | 350-400 | DMSO/MEA | 10 min | poor |
| 21 | 0.3 | 2.0 | 6.7 | 350-400 | DMSO/MEA | 15 min | poor |
| 22 | 0.3 | 1 | 3.3 | 350-400 | DMSO/MEA | >30 min | poor |

In some exemplary embodiments, water may be used as the lift-off solution. By controlling the component of the barrier layer composition and the thickness ratio of barrier layer/oxide film, the barrier layer may be easily removed by water in the last lift-off step. Further, the edges of patterned oxide film are sharp and non-burring.

The exemplary embodiments simplify or reduce the steps of patterning oxide film by utilizing a barrier layer composition containing inorganic component. By controlling the thickness ratio of the barrier layer to the oxide film, the limitation in the materials and the process compatibility caused by the organic barrier layer and photolithography process have been overcome. In addition, the disclosed process may replace the conventional photolithography process so as to increase the efficiency of printing pattern processes.

The exemplary embodiments provide a novel patterning process for oxide film. The operation temperature may be in the range of about 100-550° C. by controlling the component of the barrier layer composition and the thickness ratio of the barrier layer to the oxide film. Therefore, the patterning process is particularly applicable to metal oxide film that requires a high deposition temperature. The patterning process is applicable to indium tin oxide (ITO) film and other non-etchable metals (for example, fluorine-doped tin oxide (FTO), lithium-fluorine-doped tin oxide (LFTO)).

Compared to conventional barrier layers formed of organic materials, the exemplary embodiments employ the barrier layer composition containing 50 wt % or more of inorganic solid content to form a barrier layer for easy lift-off.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A patterning process for an oxide film, comprising:
covering a barrier layer composition on a substrate to form a patterned barrier layer, wherein the barrier layer composition comprises an inorganic component and an organic binder with a weight ratio of 50-98:2-50;
forming an oxide film on the patterned barrier layer and the substrate, wherein a thickness ratio (D1/D2) of the barrier layer (D1) to the oxide film (D2) is about 5-2000; and
lifting off the barrier layer and the oxide film thereon, while leaving portions of the oxide film on the substrate.

2. The patterning process for an oxide film as claimed in claim 1, wherein a solid content of the barrier layer composition comprises 50-98 wt % inorganic component.

3. The patterning process for an oxide film as claimed in claim 1, wherein the inorganic component comprises: metal, metal oxide, or combinations thereof.

4. The patterning process for an oxide film as claimed in claim 1, wherein the oxide film comprises metal oxide.

5. The patterning process for an oxide film as claimed in claim 4, wherein the metal oxide comprises tin oxide, zinc oxide, indium tin oxide (ITO), fluorine-doped tin oxide (FTO), lithium-fluorine doped tin oxide (LFTO), silicon oxide, indium gallium zinc oxide (IGZO), or combinations thereof.

6. The patterning process for an oxide film as claimed in claim 1, wherein the step of lifting off the barrier layer and the oxide film thereon, comprises using a lift-off solution.

7. The patterning process for an oxide film as claimed in claim 6, wherein the pH value of the lift-off solution is 2-13.

8. The patterning process for an oxide film as claimed in claim 6, wherein the lift-off solution comprises an aqueous or an organic solution.

9. The patterning process for an oxide film as claimed in claim 6, wherein the lift-off solution comprises water, ammonia water, acetic acid, dimethyl sulfoxide (DMSO), or monoethanolamine (MEA).

10. The patterning process for an oxide film as claimed in claim 1, wherein the oxide film comprises a multi-layer stack structure.

11. The patterning process for an oxide film as claimed in claim 1, wherein the oxide film is formed at a deposition temperature of 100-550° C.

* * * * *